United States Patent
Huang (10) Patent No.: US 10,522,238 B1
(45) Date of Patent: Dec. 31, 2019

(54) MEMORY CORRECTING METHOD

(71) Applicant: TARGPS TECHNOLOGY CORP., New Taipei (TW)

(72) Inventor: Chih-Jen Huang, New Taipei (TW)

(73) Assignee: Targps Technology Corp., New Taipei (TW)

( * ) Notice: Subject to any disclaimer, the term of this patent is extended or adjusted under 35 U.S.C. 154(b) by 0 days.

(21) Appl. No.: 16/043,527

(22) Filed: Jul. 24, 2018

(51) Int. Cl.
| | |
|---|---|
| G11C 29/44 | (2006.01) |
| G11C 29/52 | (2006.01) |
| G11C 29/42 | (2006.01) |
| G11C 16/34 | (2006.01) |
| G06F 11/10 | (2006.01) |
| G11C 29/04 | (2006.01) |

(52) U.S. Cl.
CPC ............ *G11C 29/44* (2013.01); *G06F 11/106* (2013.01); *G06F 11/1068* (2013.01); *G11C 16/349* (2013.01); *G11C 16/3431* (2013.01); *G11C 29/42* (2013.01); *G11C 29/52* (2013.01); *G11C 2029/0411* (2013.01)

(58) Field of Classification Search
CPC .................................. G11C 29/44; G11C 29/52
See application file for complete search history.

(56) References Cited

U.S. PATENT DOCUMENTS

| | | | |
|---|---|---|---|
| 2008/0010435 A1* | 1/2008 | Smith ................. | G06F 11/1076 712/10 |
| 2010/0271891 A1* | 10/2010 | Dell ........................ | G11C 5/06 365/200 |
| 2011/0209031 A1* | 8/2011 | Kim ..................... | G06F 11/1048 714/763 |
| 2013/0173970 A1* | 7/2013 | Kleveland .............. | G11C 29/44 714/710 |
| 2014/0289574 A1* | 9/2014 | Tsern ................ | G11C 29/50016 714/718 |
| 2017/0192691 A1* | 7/2017 | Zhang .................... | G11C 29/42 |
| 2018/0151250 A1* | 5/2018 | Choi .................... | G11C 29/783 |
| 2019/0096472 A1* | 3/2019 | Kang ................ | G11C 11/40615 |

* cited by examiner

*Primary Examiner* — Joseph D Torres
(74) *Attorney, Agent, or Firm* — Rosenberg, Klein & Lee (57) ABSTRACT

A memory correcting method includes steps: providing a memory with a plurality of memory bytes; respectively adding a plurality of correcting bytes to the plurality of memory bytes; providing a plurality of non-volatile compared memory bytes; detecting whether there are any underperforming bits in the plurality of memory bytes, the plurality of correcting bytes, and the plurality of compared memory bytes of the memory to complete the correction. Alternatively, the method respectively provides a plurality of compared memory address bytes for the plurality of memory bytes and for the plurality of correcting bytes for labeling underperforming-bit addresses. Then, the method detects whether there are any underperforming bits in the plurality of memory bytes, the plurality of correcting bytes, and the plurality of compared memory address bytes of the memory to complete the correction.

8 Claims, 6 Drawing Sheets

Fig. 4

MEMORY CORRECTING METHOD

BACKGROUND OF THE INVENTION

Field of the Invention

The present invention relates to a memory correcting method, particularly to a bit-scale memory correcting method.

Description of the Prior Art

Nowadays, memories are divided into non-volatile memories and volatile memories. For example, the volatile memory may be Random Access Memory (RAM) that directly exchanges data with the central processing unit (CPU) of a computer. RAM is also called a main memory that can read and write data very rapidly at any time and used as a temporary media of storing data for an operating system or an executing program. RAM may be Static Random-Access Memory (SRAM) or Dynamic Random Access Memory (DRAM). SRAM has an advantage of fast access and a disadvantage of an expensive production cost. SRAM is used for rapidly access data. Since DRAM has a lower price per unit capacity, DRAM is used as the main memory of the system. Besides, there are other novel memories, such as phase-change memories, resistive random access memories, and magnetoresistive random access memories.

Since SRAM operates fast, SRAM is used as a buffer device between CPU and DRAM of the computer. For example, not affected by output bits, a cache memory can increase the operation speed of the system. Thus, SRAM having a great number of output bits aims to be designed. However, after completing high-capacity memories, various imperfect factors in a process of fabricating integrated circuits (ICs) easily cause the memories to form internal errors, decrease the yield of the memories, or disable the memories with the increase of capacities and the density of memory bits arranged into an array.

Errors are easily caused when memories are fabricated. Thus, when a memory is initially designed, a part of the internal space of the memory is provided for redundant memory bits. When errors and underperforming memory bits are found in the memory under test, the redundant memory bits replace the underperforming memory bits to correct the memory and effectively enhance the fabrication yield of memories.

Presently, most of the conventional volatile memories are provided with row redundancy circuits to replace the damaged memory arrays. The row redundancy circuit has a simple structure that cannot greatly increase the size of the chip. However, a column redundancy structure is quite complicated. When the column redundancy structure is added to the redundant memory bits, the area of the chip is greatly increased. As a result, the column redundancy structure does not be added to the memory, such that damaged bits are corrected when data are outputted from column arrays. In addition, every bit of the conventional memory is detected. In the detecting way, the speed of memories that operate rapidly and have damaged memory bits is decreased and the fabrication yield of the memories is reduced. Accordingly, in order to guarantee the yield, the conventional memories have larger areas.

In the trend of scaling down various electronic products, various volatile memories need to reduce their size. Nevertheless, how to find the best way to deal with a conflict among yield, operation speed, and size is a problem to be difficultly overcame.

In order to overcome the abovementioned problems, the present invention proposes a memory correcting method to correct memory bytes of a memory.

SUMMARY OF THE INVENTION

The primary objective of the present invention is to provide a memory correcting method, which increases the speed of correcting a memory and the fabrication yield of the memory whereby the volume of the fabricated memory chip is smaller than that of the conventional memory chip and suitable for various volume-reduced electronic products.

Another objective of the present invention is provide a memory correcting method, which uses correcting bits to replace data bits that need to be corrected or uses a plurality of non-volatile compared memory bytes to label underperforming bits in order to avoid underperforming bits caused by an imperfection in fabrication while fabricating a memory. Then, detecting and correcting processes are performed on the memory, such that the memory successfully operates.

In order to achieve the abovementioned objectives, the present invention proposes a memory correcting method, which comprises steps: providing a memory with a plurality of memory bytes each having M bits, wherein M is a positive integer; respectively adding a plurality of correcting bytes to the plurality of memory bytes, wherein each of the plurality of correcting bytes has N correcting bits, and wherein N is a positive integer and smaller than M; providing a plurality of non-volatile compared memory bytes, wherein the number of total bits of the plurality of non-volatile compared memory bytes is larger than or equal to the number of total bits of the memory and the plurality of correcting bytes; detecting whether there are any underperforming bits in the plurality of memory bytes, the plurality of correcting bytes, and the plurality of compared memory bytes of the memory: if no, terminating the correction of the memory; and if yes, using non-underperforming the correcting bits of the plurality of correcting bytes to replace all the underperforming bits of the plurality of memory bytes, thereby completing the correction of the plurality of memory bytes and labeling the underperforming bits of the plurality of correcting bytes, wherein the number of the non-underperforming the correcting bits of the plurality of correcting bytes is equal to the number of the underperforming bits of the plurality of memory bytes.

In one embodiment of the present invention, the plurality of compared memory bytes are realized with a non-volatile memory, a one-time programmable memory, a multiple times programmable memory, or a NOR flash.

In one embodiment of the present invention, the plurality of compared memory bytes are realized with a phase-change memory, a resistive random access memory, or a magnetoresistive random access memory.

In one embodiment of the present invention, the plurality of compared memory bytes that correspond to the underperforming bits of the plurality of memory bytes and the plurality of correcting bytes are labeled, the underperforming bits of the plurality of compared memory bytes are labeled, and when the bits of the plurality of memory bytes and the correcting bits are detected as non-underperforming bits and the bits of the plurality of compared memory bytes are underperforming bits, the bits of the plurality of memory bytes and the correcting bits are labeled as underperforming bits via putting the bits of the plurality of compared memory bytes corresponding to the underperforming bits and the underperforming bits of the plurality of compared memory bytes to a memory state different from non-underperforming bits of the plurality of compared memory bytes.

In one embodiment of the present invention, the underperforming bits of the plurality of memory bytes, the plurality of correcting bytes, and the plurality of compared memory bytes are detected via internal reading, writing or disturbing, or external disturbing of temperature, magnetic fields or electric fields.

In one embodiment of the present invention, after the memory has been corrected, each of the bits and each of the correcting bits having been corrected are rearranged.

In one embodiment of the present invention, the plurality of memory bytes that have been corrected and the plurality of correcting bytes are used as data bits or used as parity bits of an Error-Correction Code (ECC) to enhance reliability in application.

In one embodiment of the present invention, the plurality of memory bytes, the plurality of correcting bytes, and the plurality of compared memory bytes cooperate with a bit-line correcting method and a word-line correcting method to correct bit-line-scale errors and word-line-scale errors.

The present invention proposes a memory correcting method, which comprises steps: providing a memory with a plurality of memory bytes each having M bits, wherein M is a positive integer; respectively adding a plurality of correcting bytes to the plurality of memory bytes, wherein each of the plurality of correcting bytes has N correcting bits, and wherein N is a positive integer and smaller than M; respectively providing a plurality of compared memory address bytes for the plurality of memory bytes and for the plurality of correcting bytes, wherein each of the plurality of compared memory address bytes has Q bits for labeling underperforming-bit addresses of each of the plurality of memory bytes and each of the plurality of correcting bytes, and wherein $2^Q \geq M+N$; and detecting whether there are any underperforming bits in the plurality of memory bytes, the plurality of correcting bytes, and the plurality of compared memory address bytes of the memory: if no, terminating the correction of the memory; and if yes, using a non-underperforming the correcting bit of the plurality of correcting bytes to replace the underperforming bit of the plurality of memory bytes, thereby completing the correction of the underperforming bit of the plurality of memory bytes of the memory and labeling the underperforming bits of the plurality of correcting bytes.

In one embodiment of the present invention, the plurality of compared memory address bytes are realized with a non-volatile memory, a one-time programmable memory, a multiple times programmable memory, or a NOR flash.

In one embodiment of the present invention, the plurality of compared memory address bytes are realized with a phase-change memory, a resistive random access memory, or a magnetoresistive random access memory.

In one embodiment of the present invention, the underperforming bits of the plurality of memory bytes and the plurality of correcting bytes are labeled in corresponding compared memory address bytes of the plurality of compared memory address bytes, bit addresses of the underperforming bits are put to corresponding compared memory address bytes of the plurality of compared memory address bytes, and when the plurality of memory bytes and the plurality of correcting bytes have no underperforming bits, corresponding compared memory address bytes of the plurality of compared memory address bytes are put to bit addresses different from the plurality of memory bytes.

In one embodiment of the present invention, the plurality of memory bytes that have been corrected and the plurality of correcting bytes are used as data bits or used as parity bits of an Error-Correction Code (ECC) to enhance reliability in application.

In one embodiment of the present invention, the plurality of memory bytes, the plurality of correcting bytes, and the plurality of compared memory address bytes cooperate with a bit-line correcting method and a word-line correcting method to correct bit-line-scale errors and word-line-scale errors.

In one embodiment of the present invention, the underperforming bits of the plurality of memory bytes, the plurality of correcting bytes, and the plurality of compared memory address bytes are detected via internal reading, writing or disturbing, or external disturbing of temperature, magnetic fields or electric fields.

Below, embodiments are described in cooperation with the attached drawings to make easily understood the objectives, technical contents, characteristics and accomplishments of the present invention.

DETAILED DESCRIPTION OF THE INVENTION

The present invention provides a method for correcting the conventional memory to achieve the purposes of small volume, high yield, and fast correcting speed. The method of the present invention is suitable for volume-reduced electronic products to save their space.

Figure 1:
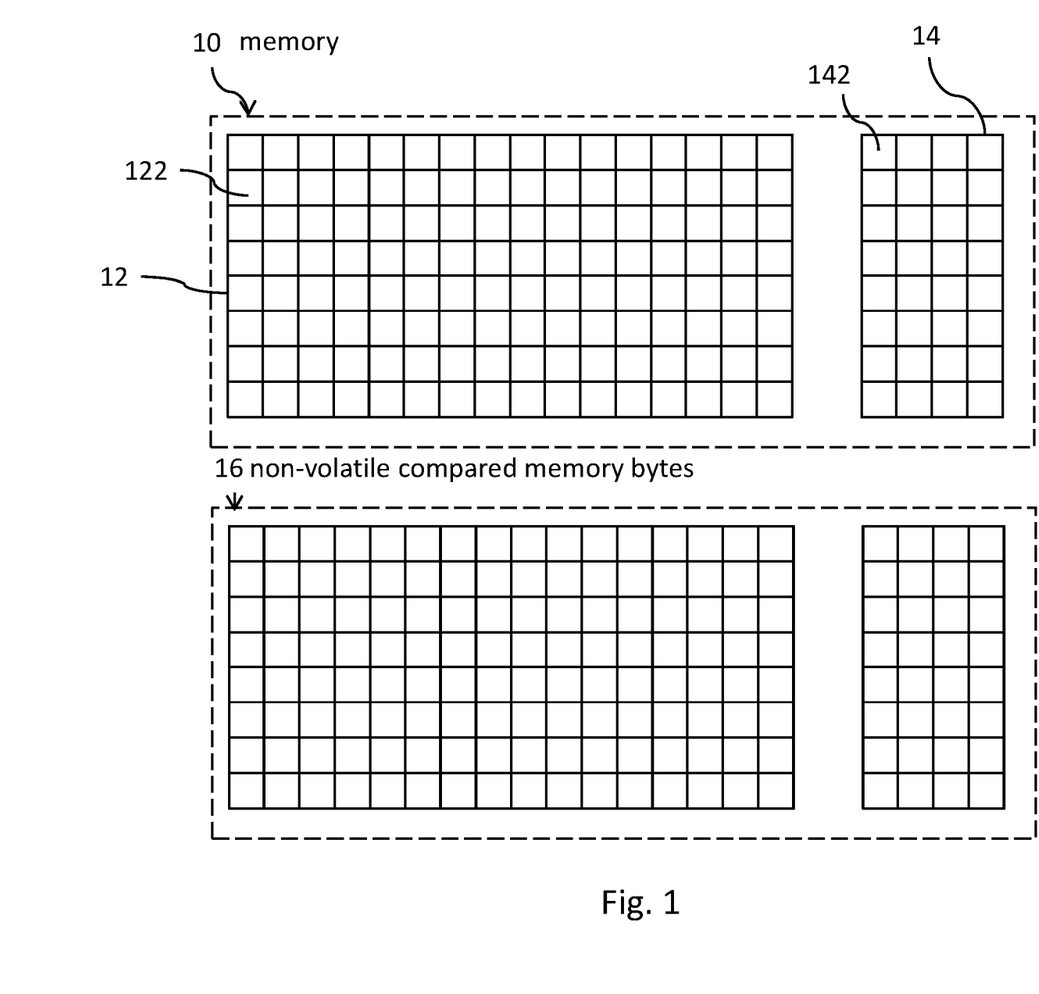
FIG. 1 is a diagram schematically showing a memory and a memory byte and a correcting byte therein according to an embodiment of the present invention.

Refer to FIG. 1. A memory 10 with a plurality of memory bytes 12 each having M bits 122 is provided, wherein M is a positive integer. A plurality of correcting bytes 14 are respectively added to the plurality of memory bytes 12, wherein each of the plurality of correcting bytes 14 has N correcting bits 142 and N is a positive integer and smaller than M. for example, the memory byte has 128 bits and the correcting byte 14 has 32 bits in the embodiment. In other words, there are 128 bits 122 and 32 correcting bits 142. Besides, a plurality of non-volatile compared memory bytes 16 are provided, wherein the number of total bits of the plurality of non-volatile compared memory bytes 16 is larger than or equal to the number of total bits of the memory 10. The compared memory byte 16 has M compared bits and N compared correcting bits. The number of the compared bits is equal to the number of the bits 122. For example, the number of the compared bits is 128. The positions of the compared bits are the same to the positions of the bits 122. The number of the compared correcting bits is equal to the number of the correcting bits 142. For example, the number of the compared correcting bits is 32. The positions of the compared correcting bits are the same to the positions of the correcting bits 142. The scope of the present invention should not be limited to the number of these bits. The plurality of compared memory bytes 16 are realized with a non-volatile memory, but the present invention is not limited thereto. The plurality of compared memory bytes 16 are alternatively realized with a one-time programmable memory, a multiple times programmable memory, a NOR flash, a phase-change memory, a resistive random access memory, or a magnetoresistive random access memory.

Refer to FIG. 2 and FIGS. 3a-3d. The present invention describes how to correct the memory 10 in detail. Firstly, in Step S10 and FIG. 3a, a memory 10 with a plurality of memory bytes 12 each having 128 bits 122 is provided. In Step S12 and FIG. 3b, a plurality of correcting bytes 14 are respectively added to the plurality of memory bytes 12, wherein each of the plurality of correcting bytes 14 has 32 correcting bits 142. In Step S14 and FIG. 3c, a plurality of non-volatile compared memory bytes 16 are provided, wherein the number of total bits of the plurality of non-volatile compared memory bytes 16 is larger than or equal to the number of total bits of the memory 10 and the plurality of correcting bytes 14. In Step S16, the process detects whether there are any underperforming bits in the plurality of memory bytes 12, the plurality of correcting bytes 14, and the plurality of compared memory bytes 16 of the memory 10. If the answer is yes, the process proceeds to Step S18. In Step S18, the non-underperforming correcting bits of the plurality of correcting bytes 14 are used to replace all the underperforming bits of the plurality of memory bytes 12, thereby completing the correction of the plurality of memory bytes 12 and labeling the underperforming bits of the plurality of correcting bytes 14, wherein the number of the non-underperforming the correcting bits of the plurality of correcting bytes 14 is equal to the number of the underperforming bits of the plurality of memory bytes 12. In the embodiment, the underperforming bits of the plurality of memory bytes 12, the plurality of correcting bytes 14, and the plurality of compared memory bytes 16 are detected via internal reading, writing or disturbing, or external disturbing of temperature, magnetic fields or electric fields. For example, the plurality of compared memory bytes 16 that correspond to the underperforming bits of the plurality of memory bytes 12 and the plurality of correcting bytes 14 are labeled, and the underperforming bits of the plurality of compared memory bytes 16 are labeled. When the bits 122 of the plurality of memory bytes 12 and the correcting bits 142 are detected as non-underperforming bits and the bits of the plurality of compared memory bytes 16 are underperforming bits, the bits 122 of the plurality of memory bytes 12 and the correcting bits 142 are labeled as underperforming bits via putting the bits of the plurality of compared memory bytes 16 corresponding to the underperforming bits and the underperforming bits of the plurality of compared memory bytes 16 to a memory state different from non-underperforming bits of the plurality of compared memory bytes 16. After the memory 10 or the plurality of compared memory bytes 16 have been corrected, each of the bits 122 and each of the correcting bits 142 having been corrected are rearranged. If the answer is no in Step S16, the process proceeds to Step S20. In Step S20, the process terminates the correction of the memory 10.

Figure 2:
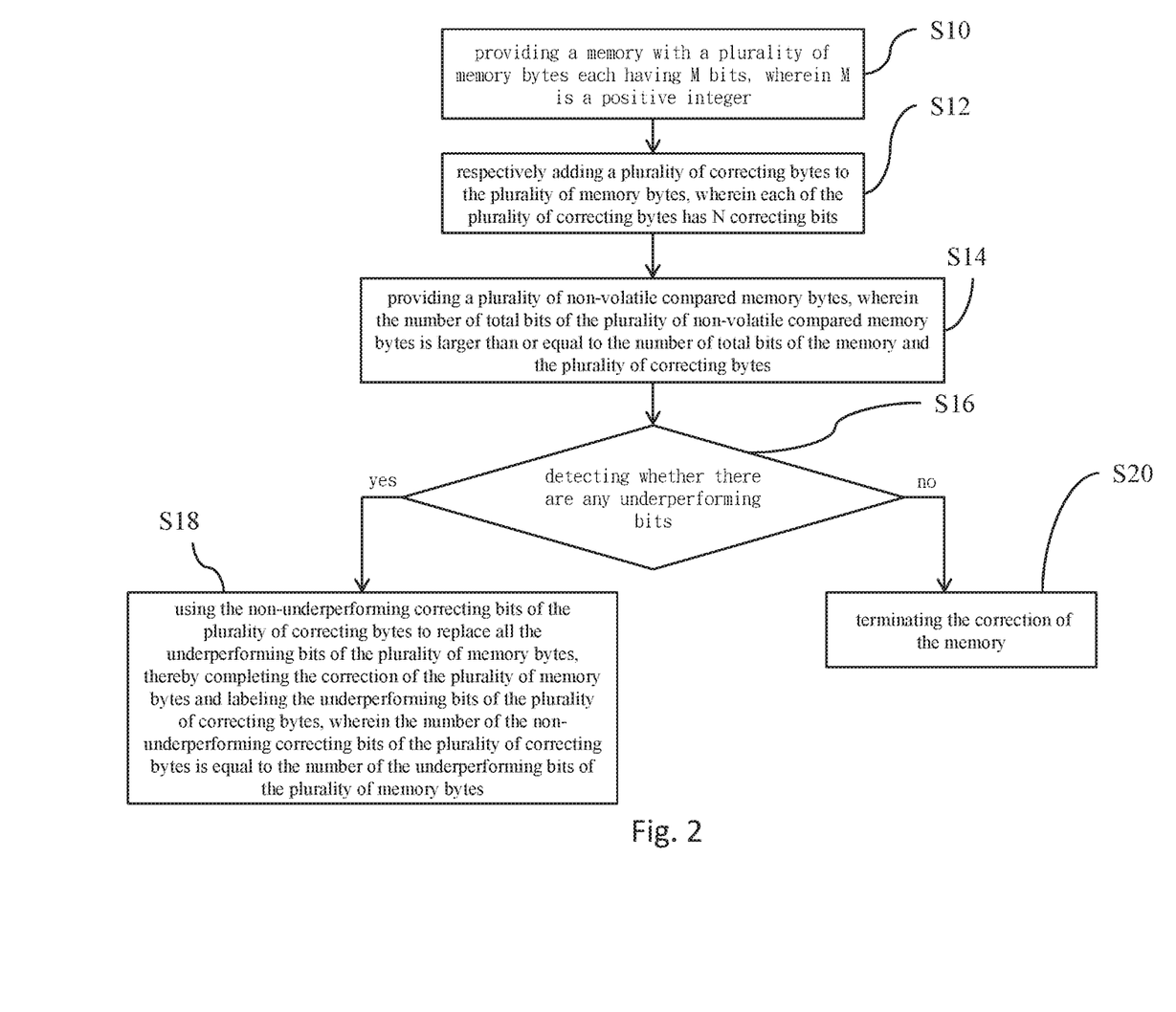
FIG. 2 is a flowchart of a memory correcting method according to the first embodiment of the present invention.
Figure 3A:
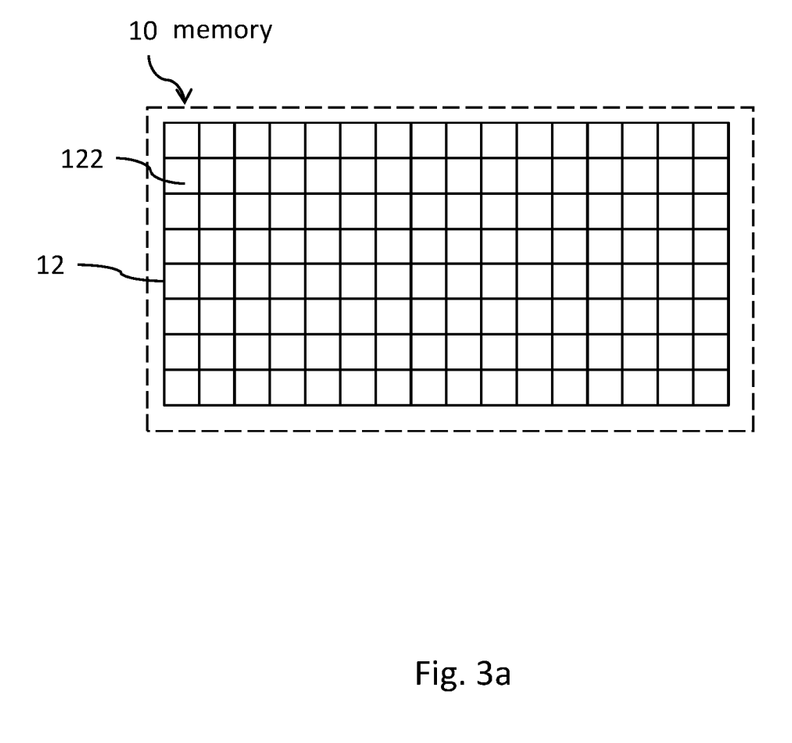
FIGS. 3a-3c are diagrams schematically showing the steps of a memory correcting method according to an embodiment of the present invention.
Figure 3B:
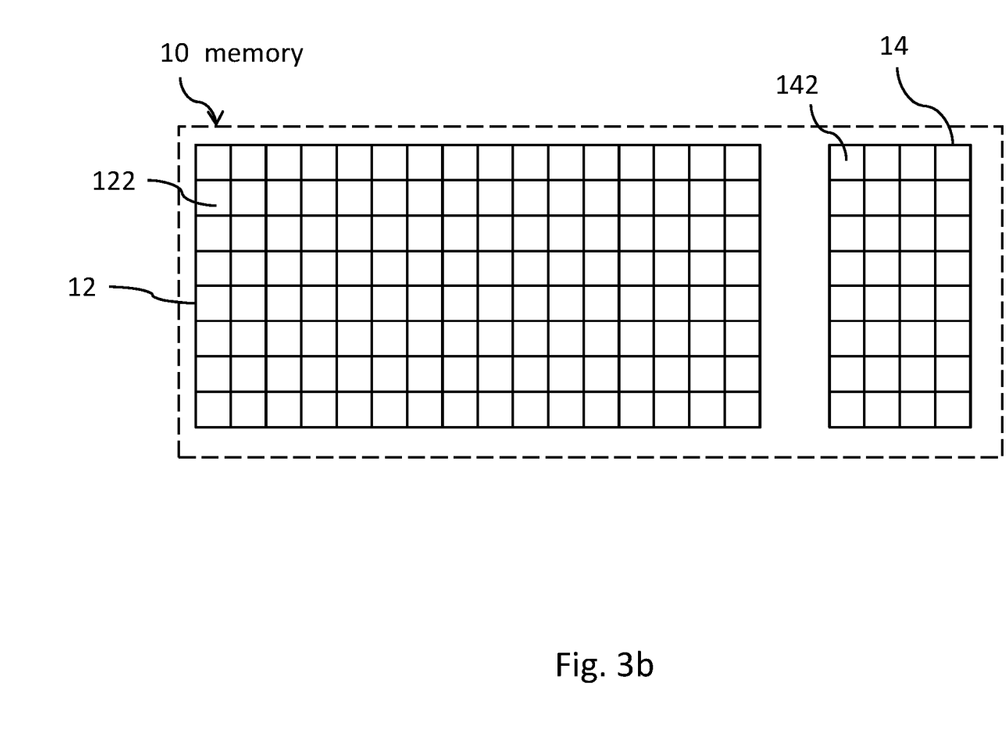
Figure 3C:
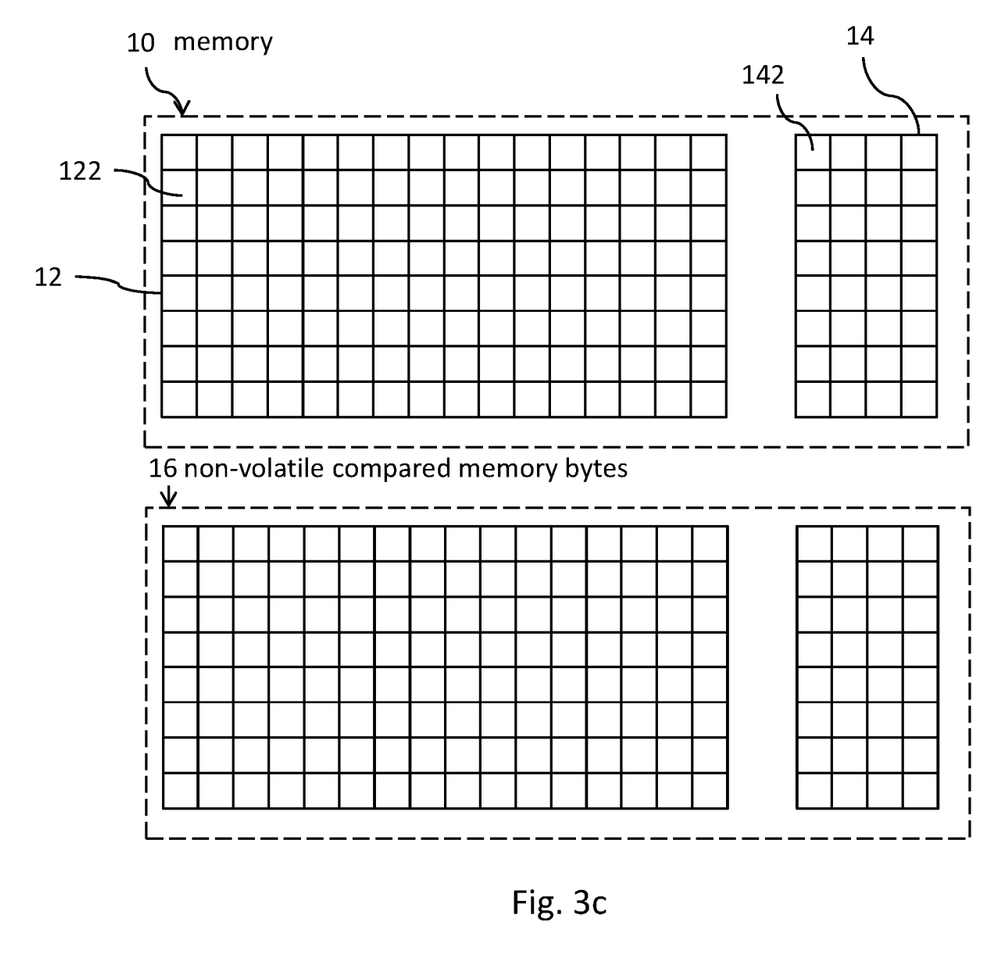

The plurality of memory bytes 12 that have been corrected and the plurality of correcting bytes 14 are used as data bits or used as parity bits of an Error-Correction Code (ECC) to enhance the reliability in application. The plurality of memory bytes 12, the plurality of correcting bytes 14, and the plurality of compared memory bytes 16 cooperate with a bit-line correcting method and a word-line correcting method to correct bit-line-scale errors and word-line-scale errors, thereby achieving the best correcting efficiency.

Figure 4:
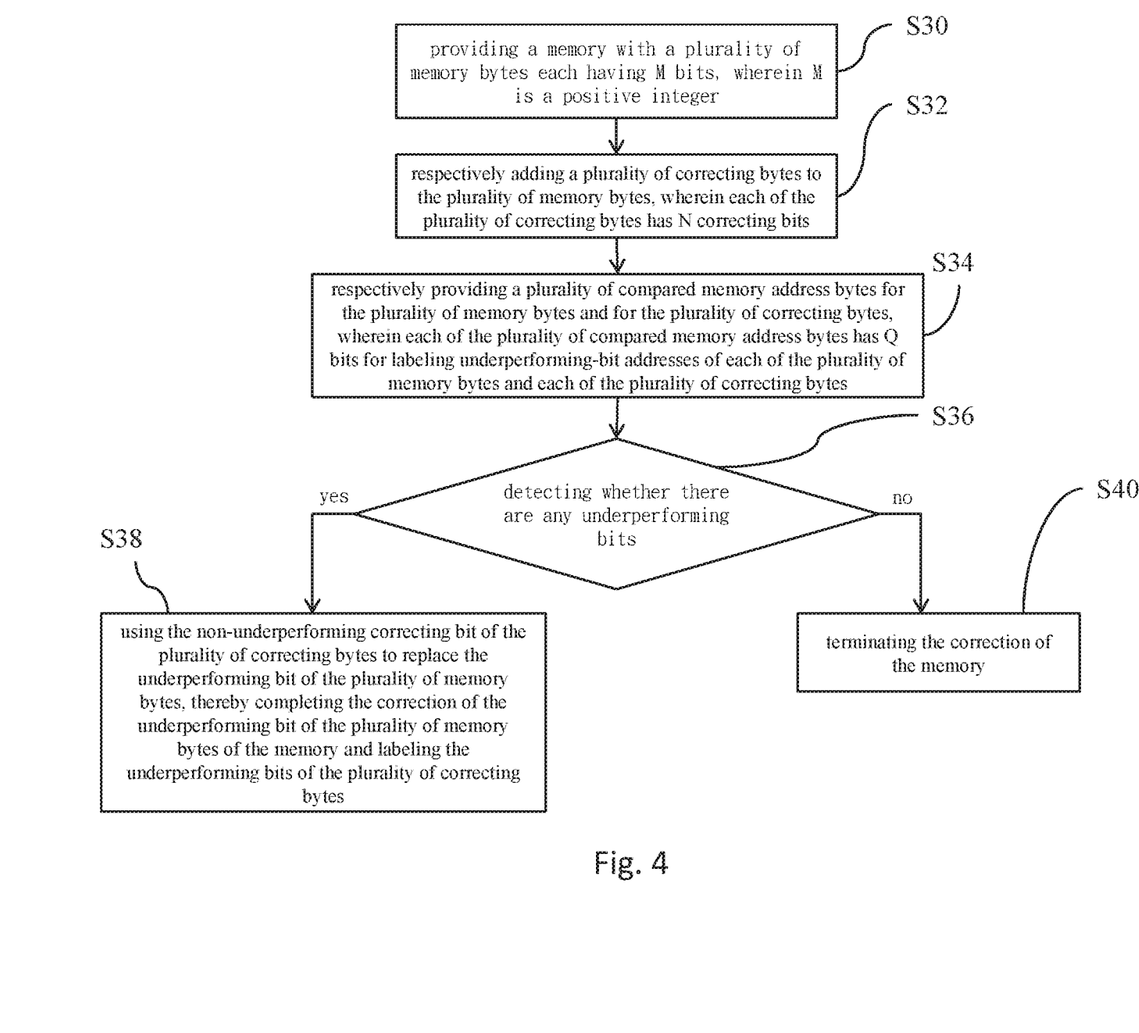
FIG. 4 is a flowchart of a memory correcting method according to the second embodiment of the present invention.

In addition to the abovementioned method, the present invention also provides another method for correcting a memory 20. Refer to FIG. 4. The present invention describes how to correct the memory 20 in detail. Firstly, in Step S30, a memory 20 with a plurality of memory bytes 22 each having M bits 222 is provided, wherein M is a positive integer. For example, there are 128 bits 222. In Step S32, a plurality of correcting bytes 24 are respectively added to the plurality of memory bytes 22, wherein each of the plurality of correcting bytes 24 has N correcting bits 242, and wherein the number of the correcting bits 242 is smaller than the number of the bits 222. For example, there are 32 correcting bits 242. In Step S34, a plurality of compared memory address bytes 26 are respectively provided for the plurality of memory bytes 22 and for the plurality of correcting bytes 24, wherein each of the plurality of compared memory address bytes 26 has Q bits 262 for labeling underperforming-bit addresses of each of the plurality of memory bytes 22 and each of the plurality of correcting bytes 24, and wherein $2^Q \geq M+N$. The plurality of compared memory address bytes are may realized with a non-volatile memory, a one-time programmable memory, a multiple times programmable memory, a NOR flash, a phase-change memory, a resistive random access memory, or a magnetoresistive random access memory, but the present invention is not limited thereto. In Step S36, the process detects whether there are any underperforming bits in the plurality of memory bytes 22, the plurality of correcting bytes 24, and the plurality of compared memory address bytes 26 of the memory 20. If the answer is yes, a non-underperforming correcting bit of the plurality of correcting bytes 24 to replace the underperforming bit of the plurality of memory bytes 22, thereby completing the correction of the underperforming bit of the plurality of memory bytes 22 of the memory and labeling the underperforming bits of the plurality of correcting bytes 24. In the embodiment, the underperforming bits of the plurality of memory bytes 22, the plurality of correcting bytes 24, and the plurality of compared memory address bytes 26 are detected via internal reading, writing or disturbing, or external disturbing of temperature, magnetic fields or electric fields. For example, the underperforming bits of the plurality of memory bytes 22 and the plurality of correcting bytes 24 are labeled in corresponding compared memory address bytes 26 of the plurality of compared memory address bytes 26, bit addresses of the underperforming bits are put to corresponding compared memory address bytes 26 of the plurality of compared memory address bytes 26. When the plurality of memory bytes 22 and the plurality of correcting bytes 24 have no underperforming bits, corresponding compared memory address bytes 26 of the plurality of compared memory address bytes 26 are put to bit addresses different from the plurality of memory bytes 22. If the answer is no in Step S36, the process proceeds to Step S40 to terminate the correction of the memory 20.

The plurality of memory bytes 22 that have been corrected and the plurality of correcting bytes 24 are used as data bits or used as parity bits of an Error-Correction Code (ECC) to enhance the reliability in application. The plurality of memory bytes 22, the plurality of correcting bytes 24, and the plurality of compared memory address bytes 26 cooperate with a bit-line correcting method and a word-line correcting method to correct bit-line-scale errors and word-line-scale errors, thereby achieving the best correcting efficiency.

The present invention provides two different memory correcting methods to improve the speed and precision of correcting a memory. The present invention provides a novel memory correcting method for users. When the memory correcting method is applied to various products, the products will be more competitive.

The embodiments described above are to demonstrate the technical thoughts and characteristics of the present invention to enable the persons skilled in the art to understand, make, and use the present invention. However, these embodiments are not intended to limit the scope of the present invention. Any equivalent modification or variation according to the spirit of the present invention is to be also included within the scope of the present invention.

What is claimed is:

1. A memory correcting method comprising steps:
   providing a memory with a plurality of memory bytes each having M bits, wherein M is a positive integer;
   respectively adding a plurality of correcting bytes to the plurality of memory bytes, wherein each of the plurality of correcting bytes has N correcting bits, and wherein N is a positive integer and smaller than M;
   providing a plurality of non-volatile compared memory bytes, wherein number of total bits of the plurality of non-volatile compared memory bytes is larger than or equal to number of total bits of the memory and the plurality of correcting bytes;
   detecting whether there are any underperforming bits in the plurality of memory bytes, the plurality of correcting bytes, and the plurality of compared memory bytes of the memory:
      if no, terminating correction of the memory; and
      if yes, using non-underperforming the correcting bits of the plurality of correcting bytes to replace all the underperforming bits of the plurality of memory bytes, thereby completing correction of the plurality of memory bytes and labeling the underperforming bits of the plurality of correcting bytes, wherein number of the non-underperforming the correcting bits of the plurality of correcting bytes is equal to number of the underperforming bits of the plurality of memory bytes.

2. The memory correcting method according to claim 1, wherein the plurality of compared memory bytes are realized with a non-volatile memory, a one-time programmable memory, a multiple times programmable memory, or a NOR flash.

3. The memory correcting method according to claim 1, wherein the plurality of compared memory bytes are realized with a phase-change memory, a resistive random access memory, or a magnetoresistive random access memory.

4. The memory correcting method according to claim 1, wherein the plurality of compared memory bytes that correspond to the underperforming bits of the plurality of memory bytes and the plurality of correcting bytes are labeled, the underperforming bits of the plurality of compared memory bytes are labeled, and when the bits of the plurality of memory bytes and the correcting bits are detected as non-underperforming bits and the bits of the plurality of compared memory bytes are underperforming bits, the bits of the plurality of memory bytes and the correcting bits are labeled as underperforming bits via putting the bits of the plurality of compared memory bytes corresponding to the underperforming bits and the underperforming bits of the plurality of compared memory bytes to a memory state different from non-underperforming bits of the plurality of compared memory bytes.

5. The memory correcting method according to claim 4, wherein the underperforming bits of the plurality of memory bytes, the plurality of correcting bytes, and the plurality of compared memory bytes are detected via internal reading, writing or disturbing, or external disturbing of temperature, magnetic fields or electric fields.

6. The memory correcting method according to claim 1, wherein after the memory has been corrected, each of the bits and each of the correcting bits having been corrected are rearranged.

7. The memory correcting method according to claim 1, wherein the plurality of memory bytes that have been corrected and the plurality of correcting bytes are used as data bits or used as parity bits of an Error-Correction Code (ECC) to enhance reliability in application.

8. The memory correcting method according to claim 1, wherein the plurality of memory bytes, the plurality of correcting bytes, and the plurality of compared memory bytes cooperate with a bit-line correcting method and a word-line correcting method to correct bit-line-scale errors and word-line-scale errors.

* * * * *